(12) United States Patent
MirTabatabaei et al.

(10) Patent No.: US 10,985,588 B2
(45) Date of Patent: *Apr. 20, 2021

(54) SECONDARY BATTERY MANAGEMENT SYSTEM

(71) Applicant: Robert Bosch GmbH, Stuttgart (DE)

(72) Inventors: Anahita MirTabatabaei, San Francisco, CA (US); Reinhardt Klein, Mountain View, CA (US); Ashish Krupadanam, Cupertino, CA (US); Nikhil Ravi, Mountain View, CA (US); John F. Christensen, Elk Grove, CA (US)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/197,097

(22) Filed: Nov. 20, 2018

(65) Prior Publication Data

US 2019/0109466 A1 Apr. 11, 2019

Related U.S. Application Data

(63) Continuation of application No. 15/011,148, filed on Jan. 29, 2016, now Pat. No. 10,263,447.

(51) Int. Cl.
*H02J 7/00* (2006.01)
*G01R 31/382* (2019.01)
(Continued)

(52) U.S. Cl.
CPC ............ *H02J 7/007* (2013.01); *G01R 31/382* (2019.01); *H01M 10/425* (2013.01);
(Continued)

(58) Field of Classification Search
USPC .......................................................... 320/134
See application file for complete search history.

(56) References Cited

U.S. PATENT DOCUMENTS

| | | |
|---|---|---|
| 6,515,456 B1 | 2/2003 | Mixon |
| 6,534,954 B1 | 3/2003 | Plett |

(Continued)

FOREIGN PATENT DOCUMENTS

| | | |
|---|---|---|
| DE | 102005008511 | 8/2006 |
| EP | 2816366 | 12/2014 |

(Continued)

OTHER PUBLICATIONS

Proceeding of the 11th World Congress on Intelligent Control and Automation Shenyang, China, Jun. 29-Jul. 4, 2014 Lithium-ion Battery State of Charge Estimation based on Moving Horizon M. Yan, Z. Xiuwen, Z. Jixing (Year: 2014).*

(Continued)

*Primary Examiner* — Samuel Berhanu
(74) *Attorney, Agent, or Firm* — Michael Best & Friedrich LLP

(57) ABSTRACT

A method and system for managing a battery system. The method including receiving at least one measured characteristic of the battery over a pre-defined time horizon from the at least one sensor, receiving at least one estimated characteristic of the battery from a electrochemical-based battery model based on differential algebraic equations, determining a cost function of a Moving Horizon Estimation based on the at least one measured characteristic and the at least one estimated characteristic, updating the electrochemical-based battery model based on the cost function, estimating at least one state of the at least one battery cell by applying the electrochemical-based battery model, and regulating at least one of charging or discharging of the battery (Continued)

based on the estimation of the at least one state of the at least one battery cell.

20 Claims, 5 Drawing Sheets

(51) Int. Cl.
  *H01M 10/42* (2006.01)
  *H01M 10/44* (2006.01)
  *H01M 10/48* (2006.01)
  H01M 10/052 (2010.01)
  G01R 31/367 (2019.01)

(52) U.S. Cl.
  CPC ....... *H01M 10/4257* (2013.01); *H01M 10/44* (2013.01); *H01M 10/48* (2013.01); *H02J 7/0021* (2013.01); *H02J 7/0072* (2013.01); *G01R 31/367* (2019.01); H01M 10/052 (2013.01); H01M 2010/4271 (2013.01); H02J 2207/10 (2020.01); Y02T 10/70 (2013.01)

(56) References Cited

U.S. PATENT DOCUMENTS

| | | | |
|---|---|---|---|
| 7,081,755 B2 | 7/2006 | Klang et al. | |
| 7,612,532 B2 | 11/2009 | Verbrugge | |
| 7,994,755 B2 * | 8/2011 | Plett | G01R 31/3842 320/132 |
| 8,008,891 B2 * | 8/2011 | Yun | G01R 31/3842 320/132 |
| 8,103,485 B2 * | 1/2012 | Plett | H01M 10/48 703/2 |
| 8,116,998 B2 | 2/2012 | Hess | |
| 8,188,715 B2 | 5/2012 | Christensen et al. | |
| 8,310,201 B1 | 11/2012 | Wright | |
| 8,321,164 B2 | 11/2012 | Liu et al. | |
| 8,346,495 B2 | 1/2013 | Gering | |
| 8,467,984 B2 | 6/2013 | Gering | |
| 8,548,762 B2 * | 10/2013 | Prada | G01R 31/367 702/63 |
| 8,635,038 B2 | 1/2014 | Benjamin et al. | |
| 8,896,315 B1 | 11/2014 | Davies | |
| 8,965,723 B2 | 2/2015 | Jo et al. | |
| 9,086,462 B2 | 7/2015 | Mao | |
| 9,960,625 B2 | 5/2018 | Klein et al. | |
| 10,107,865 B2 * | 10/2018 | Choi | G01R 31/367 |
| 10,224,579 B2 | 3/2019 | Christensen et al. | |
| 2001/0032666 A1 | 10/2001 | Jenson et al. | |
| 2002/0097026 A1 | 7/2002 | Kernahan et al. | |
| 2003/0076109 A1 | 4/2003 | Verbrugge et al. | |
| 2004/0135548 A1 | 7/2004 | Takano et al. | |
| 2004/0220758 A1 | 11/2004 | Barsoukov et al. | |
| 2006/0111854 A1 | 5/2006 | Plett | |
| 2006/0170397 A1 | 8/2006 | Srinivasan et al. | |
| 2006/0284600 A1 | 12/2006 | Verbrugge | |
| 2007/0299620 A1 | 12/2007 | Yun et al. | |
| 2008/0074082 A1 | 3/2008 | Tae et al. | |
| 2008/0103709 A1 | 5/2008 | Yun et al. | |
| 2008/0281244 A1 | 11/2008 | Jacobs | |
| 2009/0210179 A1 | 8/2009 | Tang et al. | |
| 2009/0326842 A1 | 12/2009 | Thomas-Alyea | |
| 2010/0033132 A1 | 2/2010 | Nishi et al. | |
| 2010/0085057 A1 | 4/2010 | Nishi | |
| 2011/0025258 A1 | 2/2011 | Kim et al. | |
| 2011/0288797 A1 | 11/2011 | Schmidt | |
| 2012/0101753 A1 | 4/2012 | Lin et al. | |
| 2012/0105001 A1 | 5/2012 | Gallegos et al. | |
| 2012/0109443 A1 | 5/2012 | Takahashi et al. | |
| 2012/0150507 A1 | 6/2012 | Gallestey et al. | |
| 2012/0175953 A1 | 7/2012 | Ohkawa et al. | |
| 2012/0200298 A1 | 8/2012 | Zhang et al. | |
| 2012/0268074 A1 | 10/2012 | Cooley et al. | |
| 2012/0299552 A1 | 11/2012 | Machida | |
| 2012/0306438 A1 | 12/2012 | Howard et al. | |
| 2013/0006454 A1 | 1/2013 | Li et al. | |
| 2013/0051587 A1 | 2/2013 | Stephanou et al. | |
| 2013/0085696 A1 | 4/2013 | Xu et al. | |
| 2013/0086409 A1 | 4/2013 | Lu et al. | |
| 2013/0300190 A1 | 11/2013 | Mao et al. | |
| 2013/0300377 A1 | 11/2013 | Mao et al. | |
| 2013/0322488 A1 | 12/2013 | Yazami et al. | |
| 2014/0055488 A1 | 2/2014 | Masters | |
| 2014/0089692 A1 | 3/2014 | Hanafusa | |
| 2014/0222358 A1 | 8/2014 | Morita et al. | |
| 2014/0225620 A1 | 8/2014 | Campbell et al. | |
| 2014/0229129 A1 | 8/2014 | Campbell et al. | |
| 2014/0236511 A1 | 8/2014 | Kulkarni et al. | |
| 2014/0244225 A1 | 8/2014 | Balasingam et al. | |
| 2014/0278167 A1 | 9/2014 | Frost et al. | |
| 2014/0342193 A1 | 11/2014 | Mull et al. | |
| 2014/0350877 A1 | 11/2014 | Chow et al. | |
| 2015/0022157 A1 | 1/2015 | Takahashi | |
| 2015/0046106 A1 | 2/2015 | Wade et al. | |
| 2015/0046108 A1 * | 2/2015 | Akamine | H01M 10/48 702/63 |
| 2015/0066406 A1 | 3/2015 | Sun et al. | |
| 2015/0147608 A1 | 5/2015 | Lin et al. | |
| 2015/0197164 A1 | 7/2015 | Lee | |
| 2015/0226807 A1 | 8/2015 | Aumentado et al. | |
| 2015/0234013 A1 | 8/2015 | Migita et al. | |
| 2015/0248149 A1 | 9/2015 | Yamazaki et al. | |
| 2015/0251555 A1 | 9/2015 | Li et al. | |
| 2015/0251556 A1 | 9/2015 | Meyer | |
| 2015/0260800 A1 | 9/2015 | Baba et al. | |
| 2015/0268306 A1 | 9/2015 | Sugiyama et al. | |
| 2015/0302723 A1 | 10/2015 | Reade et al. | |
| 2015/0326038 A1 | 11/2015 | Lee | |
| 2015/0355615 A1 | 12/2015 | Lee | |
| 2016/0046199 A1 | 2/2016 | Butler et al. | |
| 2016/0090001 A1 | 3/2016 | Nomoto et al. | |
| 2016/0241058 A1 | 8/2016 | Carralero et al. | |
| 2016/0259011 A1 | 9/2016 | Joe | |
| 2017/0144562 A1 | 5/2017 | Thomas et al. | |
| 2017/0194669 A1 | 7/2017 | Christensen et al. | |
| 2017/0222447 A1 | 8/2017 | Ravi et al. | |
| 2017/0222448 A1 | 8/2017 | MirTabatabaei et al. | |
| 2017/0222449 A1 | 8/2017 | MirTabatabaei et al. | |
| 2017/0271984 A1 | 9/2017 | Kohn et al. | |
| 2018/0083461 A1 | 3/2018 | Ravi et al. | |
| 2018/0313904 A1 * | 11/2018 | Heiries | G01R 31/367 |

FOREIGN PATENT DOCUMENTS

| | | |
|---|---|---|
| KR | 20080000160 A | 1/2008 |
| KR | 20150043214 | 4/2015 |
| WO | WO 2006/057468 | 6/2006 |
| WO | WO 2006/057469 | 6/2006 |
| WO | WO 2008/154956 | 12/2008 |
| WO | WO 2011050924 | 5/2011 |
| WO | WO 2014/130519 | 8/2014 |
| WO | WO 2015/025212 | 2/2015 |
| WO | WO 2015/056963 | 4/2015 |
| WO | WO 2015/056964 | 4/2015 |
| WO | WO 2015/185802 | 12/2015 |

OTHER PUBLICATIONS

Notice of Allowance from the U.S. Patent and Trademark Office for U.S. Appl. No. 15/273,040 dated Feb. 4, 2019 (8 pages).
B. F. Lund and B. A. Foss, "Parameter ranking by orthogonalization—Applied to nonlinear mechanistic models," Automatica, vol. 44, No. 1, pp. 278-281, 2008.
Fuller et al., "Simulation and Optimization of the Dual Lithium Ion Insertion Cell," J. Electrochem. Soc., vol. 141, No. 1, Jan. 1994, pp. 1-10.
Ioannou et al., "Robust adaptive control." Courier Corporation, 2012.
K. Thomas, J. Newman and R. Darling, "Mathematical Modeling of Lithium Batteries," Kluwer Academic/Plenum Publishers, pp. 345-392, 2002.

(56) References Cited

OTHER PUBLICATIONS

Klein, R. et al., 2013. "Electrochemical Model Based Observer Design for a Lithium-Ion Battery." Control Systems Technology, IEEE Transactions on, 21(2), pp. 289-301.
M. Doyle, T.F. Fuller, J. Newman, "Modeling of Galvanostatic Charge and Discharge of the Lithium/Polymer/Insertion Cell", Journal of the Electrochemical Society, 1993.
Mayhew et al., "Investigation of projection-based model-reduction techniques for solid-phase diffusion in Li-ion batteries," American Control Conference (ACC), 2014 , pp. 123-128, Jun. 4-6, 2014.
Moura et al., "Adaptive PDE Observer for Battery SOC/SOH Estimation," ASME 2012 5th Annual Dynamic Systems and Control Conference joint with the JSME 2012 11th Motion and Vibration Conference, 2012 (10 pages).
Murray, Chapter 3, State Estimation, Caltech, (https://www.cds.caltech.edu/~murray/wiki/images/b/b3/Stateestim.pdf) available online as early as Sep. 20, 2006, pp. 9-17.
N. Chaturvedi, et al., "Modeling, estimation, and control challenges for lithium-ion batteries," 2010 American Control Conference, pp. 1997-2002, 2010.
N. Chaturvedi, J. Christensen, R. Klein and A. Kojic, "Approximations for Partial Differential Equations Appearing in Li-Ion Battery Models," ASME 2013 Dynamic Systems and Control Conference (10 pages).
N. Chaturvedi, R. Klein, J. Christensen, J. Ahmed and A. Kojic, "Algorithms for Advanced Battery Management Systems," IEEE Control Systems Magazine, vol. 30, No. 3, pp. 49-68, 2010.
Pattel, "An Evaluation of the Moving Horizon Estimation Algorithm for Online Estimation of Battery State of Charge and State" Thesis, Purdue University, Dec. 2014.
Ramadesigan et al., "Modeling and Simulation of Lithium-Ion Batteries from a Systems Engineering Perspective," Journal of the Elect rochemical Society, 159 (3) R3 I-R45 (2012).
Rao, C. V., Rawlings, J. B., & Mayne, D. Q. (2003). "Constrained state estimation for nonlinear discrete-time systems: Stability and moving horizon approximations." Automatic Control, IEEE Transactions, 48(2), 246-258.
Tenny, M. J., & Rawlings, J. B. (2002). "Efficient moving horizon estimation and nonlinear model predictive control." In American Control Conference, 2002. Proceedings of the 2002 (vol. 6, pp. 4475-4480). IEEE.
Thomas, "Lithium-Ion Batteries: Thermal and Interfacial Phenomena," Dissertation, Princeton University, 1996, published 2002, pp. 66-73.
Written Opinion of the International Searching Authority for Application No. PCT/EP2017/051333 dated May 9, 2017 (10 pages).
International Search Report for Application No. PCT/EP2017/051325 dated Apr. 7, 2017 (5 pages).
Ma Yan et al., "Lithium-ion Battery State of Charge Estimation based on Moving Horizon", Proceedings of the 11th World Congress on Intelligent Control and Automation, Jun. 29, 2014 (Jun. 29, 2014),—Jul. 4, 2014 (Jul. 4, 2014), pp. 5002-5007.
Sridhar Ungarala, "Computing arrival cost parameters in moving horizon estimation using sampling based filters", Journal of Process Control, vol. 19, No.-9, Oct. 2009 (Oct. 2009), pp. 1576-1588.
Non-Final Office Action from the U.S. Patent and Trademark Office for U.S. Appl. No. 15/010,873 dated Aug. 31, 2018 (9 pages).
Abu-Sharkh et al., "Rapid test and non-linear model characterisation of solid-state lithium-ion batteries", Journal of Power Sources, vol. 130, 2004, pp. 266-274.
Bloom et al., "Differential voltage analyses of high-power, lithium-ion cells 1. Technique and application", Journal of Power Sources, vol. 139, 2005, pp. 295-303.
Christensen et al., "Cyclable Lithium and Capacity Loss in Li-Ion Cells", Journal of the Electrochemical Society, vol. 152, No. 4, 2005, pp. A818-A829.
Christensen et al., "Effect of Anode Film Resistance on the Charge/Discharge Capacity of a Lithium-Ion Battery", Journal of the Electrochemical Society, vol. 150, No. 11, 2003, pp. A1416-A1420.
Notice of Preliminary Rejection from the Korean Intellectual Property Office for Application No. 10-2018-7021773 dated Mar. 31, 2020 (9 pages).

\* cited by examiner

SECONDARY BATTERY MANAGEMENT SYSTEM

CROSS-REFERENCE TO RELATED APPLICATION

This application is continuation of U.S. application Ser. No. 15/011,148, filed Jan. 29, 2016, the entire content of which is hereby incorporated by reference.

STATEMENT REGARDING FEDERALLY SPONSORED RESEARCH

This invention was made with government support under ARPA-E Award No. DE-AR0000278 awarded by the U.S. Department of Energy. The U.S. government has certain rights in the invention.

FIELD

The invention generally relates to batteries, and more particularly to managing the operation of a battery.

BACKGROUND

Rechargeable lithium batteries are attractive energy storage devices for portable electric and electronic devices and electric and hybrid-electric vehicles because of their high specific energy compared to other electrochemical energy storage devices. A typical lithium cell contains a negative electrode, a positive electrode, and a separator located between the negative and positive electrodes. Both electrodes contain active materials that react with lithium reversibly. In some cases, the negative electrode may include lithium metal, which can be electrochemically dissolved and deposited reversibly. The separator contains an electrolyte with a lithium cation, and serves as a physical barrier between the electrodes such that none of the electrodes are electrically connected within the cell.

Typically, during charging, there is generation of electrons at the positive electrode and consumption of an equal amount of electrons at the negative electrode. During discharging, opposite reactions occur.

During repeated charge/discharge cycles of the battery undesirable side reactions occur. These undesirable side reactions result in the reduction of the capacity of the battery to provide and store power.

SUMMARY

Traditional approaches to managing the undesirable side reactions in a battery include limiting the rate of charge/discharge of the battery in an attempt to minimize the undesired effects. These efforts can result in extended charge times and peak power reduction. Thus, there is a need for a system and method for the determination of the states and parameters within a secondary battery allowing the battery management system to efficiently regulate the operation of the battery.

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Embodiments of the disclosure are related to systems and methods for managing the operation of a battery management system that estimates various states and parameters of a battery using a Moving Horizon Estimation method.

In one embodiment, the disclosure provides a method of managing a battery system. The battery system including at least one battery cell, at least one sensor coupled to the at least one battery cell and configured to measure at least one characteristic of the battery cell, and a battery management system coupled to the at least one sensor and including a microprocessor and a memory. The method comprising receiving, by the battery management system, at least one measured characteristic of the battery over a pre-defined time horizon from the at least one sensor, receiving, by the battery management system, at least one estimated characteristic of the battery from an electrochemical-based battery model based on differential algebraic equations, determining, by the battery management system, a cost function of a Moving Horizon Estimation method based on the at least one measured characteristic and the at least one estimated characteristic, updating, by the battery management system, the electrochemical-based battery model based on the cost function of the Moving Horizon Estimation Method, estimating, by the battery management system, at least one state of the at least one battery cell by applying the electrochemical-based battery model that applies differential algebraic equations to account for physical parameters of a chemical composition of the at least one battery cell, and regulating, by the battery management system, at least one of charging or discharging of the battery based on the estimation of the at least one state of the at least one battery cell.

In another embodiment, the disclosure provides a battery management system. The battery management system comprising a processor and a memory storing instructions. The instructions, when executed by the processor, cause the battery management system to receive at least one measured characteristic of at least one battery cell over a pre-defined time horizon from at least one sensor, wherein the at least one battery cell and the at least one sensor are part of a battery system, receive at least one estimated characteristic of the at least one battery cell from a electrochemical-based battery model based on differential algebraic equations, determine a cost function of a Moving Horizon Estimation method based on the at least one measured characteristic and the at least one estimated characteristic, update the electrochemical-based battery model based on the cost function of the Moving Horizon Estimation Method, estimate at least one state of the at least one battery cell by applying the electrochemical-based battery model that applies differential algebraic equations to account for physical parameters of a chemical composition of the at least one battery cell, and regulate at least one of charging or discharging of the battery based on the estimation of the at least one state of the at least one battery cell.

The details of one or more features, aspects, implementations, and advantages of this disclosure are set forth in the accompanying drawings, the detailed description, and the claims below.

DETAILED DESCRIPTION

One or more specific embodiments will be described below. Various modifications to the described embodiments will be readily apparent to those skilled in the art, and the general principles defined herein may be applied to other embodiments and applications without departing from the spirit and scope of the described embodiments. Thus, the described embodiments are not limited to the embodiments shown, but are to be accorded the widest scope consistent with the principles and features disclosed herein.

Figure 1:
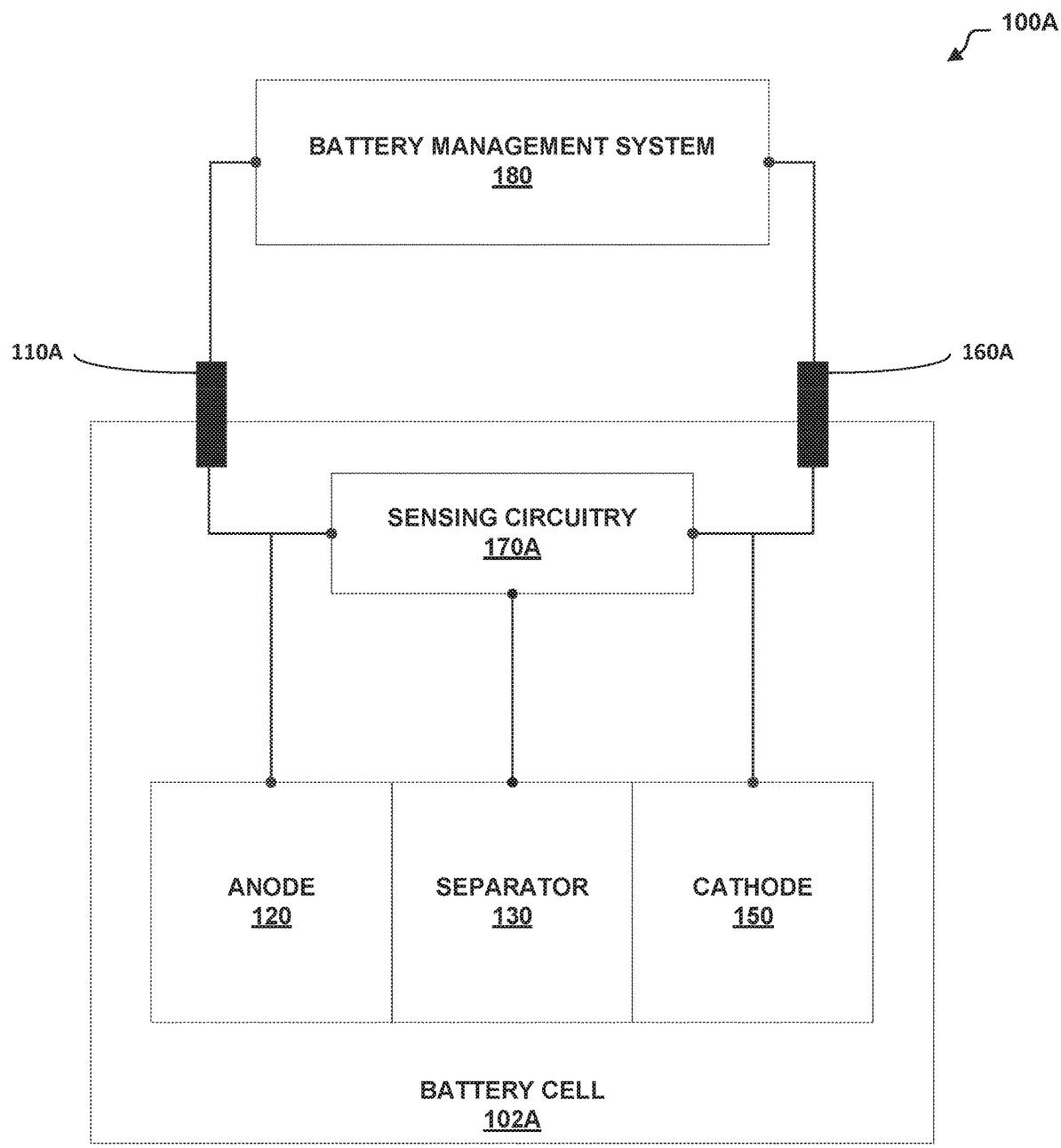
FIG. 1 is a schematic diagram illustrating a battery system including a battery cell and a battery management system with sensing circuitry incorporated into the battery cell, in accordance with some embodiments.

An embodiment of a battery system 100A is shown in FIG. 1. The battery system 100A includes a battery cell 102A, an anode tab 110, an anode 120, a separator 130, a cathode 150, a cathode tab 160, sensing circuitry 170A, and a battery management system 180. In some examples, the separator 130 may be an electrically insulating separator. In some embodiments, the electrically insulating separator comprises a porous polymeric film. In various embodiments the thickness dimension of the components of the battery cell 102A may be for the anode 120 about 5 to about 110 micrometers, for the separator 130 less than about 50 micrometers or in certain embodiments less than about 10 micrometers, and for the cathode 150 about 50 to about 110 micrometers.

During the discharge of battery cell 102A, lithium is oxidized at the anode 120 to form a lithium ion. The lithium ion migrates through the separator 130 of the battery cell 102A to the cathode 150. During charging the lithium ions return to the anode 120 and are reduced to lithium. The lithium may be deposited as lithium metal on the anode 120 in the case of a lithium anode 120 or inserted into the host structure in the case of an insertion material anode 120, such as graphite, and the process is repeated with subsequent charge and discharge cycles. In the case of a graphitic or other Li-insertion electrode, the lithium cations are combined with electrons and the host material (e.g., graphite), resulting in an increase in the degree of lithiation, or "state of charge" of the host material. For example, x Li$^+$+x e$^-$+C$_6$→Li$_x$C$_6$.

The anode 120 may comprise an oxidizable metal, such as lithium or an insertion material that can insert Li or some other ion (e.g., Na, Mg, or other suitable ion). The cathode 150 may comprise various materials such as sulfur or sulfur-containing materials (e.g., polyacrylonitrile-sulfur composites (PAN-S composites), lithium sulfide (Li$_2$S)); vanadium oxides (e.g., vanadium pentoxide (V$_2$O$_5$)); metal fluorides (e.g., fluorides of titanium, vanadium, iron, cobalt, bismuth, copper and combinations thereof); lithium-insertion materials (e.g., lithium nickel manganese cobalt oxide (NMC), lithium-rich NMC, lithium nickel manganese oxide (LiNi$_{0.5}$Mn$_{1.5}$O$_4$)); lithium transition metal oxides (e.g., lithium cobalt oxide (LiCoO$_2$), lithium manganese oxide (LiMn$_2$O$_4$), lithium nickel cobalt aluminum oxide (NCA), and combinations thereof); lithium phosphates (e.g., lithium iron phosphate (LiFePO$_4$)).

The particles may further be suspended in a porous, electrically conductive matrix that includes polymeric binder and electronically conductive material such as carbon (carbon black, graphite, carbon fiber, etc.). In some examples, the cathode may comprise an electrically conductive material having a porosity of greater than 80% to allow the formation and deposition/storage of oxidation products such as lithium peroxide (Li$_2$O$_2$) or lithium sulfide, (Li$_2$S) in the cathode volume. The ability to deposit the oxidation product directly determines the maximum power obtainable from the battery cell. Materials which provide the needed porosity include carbon black, graphite, carbon fibers, carbon nanotubes, and other non-carbon materials. The pores of the cathode 150, separator 130, and anode 120 are filled with an ionically conductive electrolyte that contains a salt such as lithium hexafluorophosphate (LiPF$_6$) that provides the electrolyte with an adequate conductivity which reduces the internal electrical resistance of the battery cell. The electrolyte solution enhances ionic transport within the battery cell. Various types of electrolyte solutions are available including, non-aqueous liquid electrolytes, ionic liquids, solid polymers, glass-ceramic electrolytes, and other suitable electrolyte solutions.

The separator 130 may comprise one or more electrically insulating ionic conductive materials. In some examples, the suitable materials for separator 130 may include porous polymers, ceramics, and two dimensional sheet structures such as graphene, boron nitride, and dichalcogenides. In certain examples the pores of the separator 130 may be filled with an ionically conductive electrolyte that contains a lithium salt such as lithium hexafluorophosphate (LiPF$_6$) that provides the electrolyte with an adequate conductivity which reduces the internal electrical resistance of the battery cell.

The battery management system 180 is communicatively connected to the battery cell 102A. In one example, the battery management system 180 is electrically connected to the battery cell 102A via electrical links (e.g., wires). In another example, the battery management system 180 may be wirelessly connected to the battery cell 102A via a wireless communication network. The battery management system 180 may be for example a microcontroller (with memory and input/output components on a single chip or within a single housing) or may include separately configured components, for example, a microprocessor, memory, and input/output components. The battery management system 180 may also be implemented using other components or combinations of components including, for example, a digital signal processor (DSP), an application specific integrated circuit (ASIC), a field-programmable gate array (FPGA), or other circuitry. Depending on the desired configuration, the processor may include one more levels of caching, such as a level cache memory, one or more processor cores, and registers. The example processor core may include an arithmetic logic unit (ALU), a floating point unit (FPU), or any combination thereof. The battery management system 180 may also include a user interface, a communication interface, and other computer implemented devices for performing features not defined herein may be incorporated into the system. In some examples, the battery management system 180 may include other computer implemented devices such as a communication interface, a user interface, a network communication link, and an interface bus for facilitating communication between various interface devices, computing implemented devices, and one or more peripheral interfaces to the microprocessor.

The memory of the battery management system 180 may include computer-readable instructions that, when executed by the electronic processor of the battery management system 180, cause the battery management system and, more particularly the electronic processor, to perform or control the performance of various functions or methods attributed to battery management system 180 herein (e.g., calculate a state or parameter of the battery system, regulate the operation of the battery system, detect an internal short from a dendrite formation). The memory may include any transitory, non-transitory, volatile, non-volatile, magnetic, optical, or electrical media, such as a random access memory (RAM), read-only memory (ROM), non-volatile RAM (NVRAM), electrically-erasable programmable ROM (EEPROM), flash memory, or any other digital or analog media. The functions attributed to the battery management system 180 herein may be embodied as software, firmware, hardware or any combination thereof. In one example, the battery management system 180 may be embedded in a computing device and the sensing circuity 170A is configured to communicate with the battery management system 180 of the computing device external to the battery cell 102A. In this example, the sensing circuitry 170A is configured to have wireless and/or wired communication with the battery management system 180. For example, the sensing circuitry 170A and the battery management system 180 of the external device are configured to communicate with each other via a network. In yet another example, the battery management system 180 is remotely located on a server and the sensing circuitry 170A is configured to transmit data of the battery cell 102A to the battery management system 180. In the above examples, the battery management system 180 is configured to receive the data and send the data to an electronic device for display as human readable format. The computing device may be a cellular phone, a tablet, a personal digital assistant (PDA), a laptop, a computer, a wearable device, or other suitable computing device. The network may be a cloud computing network, a server, a wireless area network (WAN), a local area network (LAN), an in-vehicle network, a cloud computing network, or other suitable network.

The battery management system 180 is configured to receive data from the sensing circuitry 170A including, for example, current, voltage, and/or resistance measurements. The sensing circuitry 170A may include one or more sensors. Each sensor of the sensing circuitry 170A may measure one or more characteristics (e.g., a current, a voltage, a resistance, and/or a temperature) of the battery cell 102A. The sensing circuitry 170A may be located internal to the battery cell 102A. Battery management system 180 is also configured to determine a condition of the battery cell 102A (e.g., state-of-charge (SOC) and/or state-of-health (SOH)). Based on the determined condition of battery cell 102A, the battery management system 180 may alter the operating parameters of the battery cell 102A to maintain the internal structure of the battery cell 102A. The battery management system 180 may also notify a user of the condition of the battery cell 102A.

Figure 2:
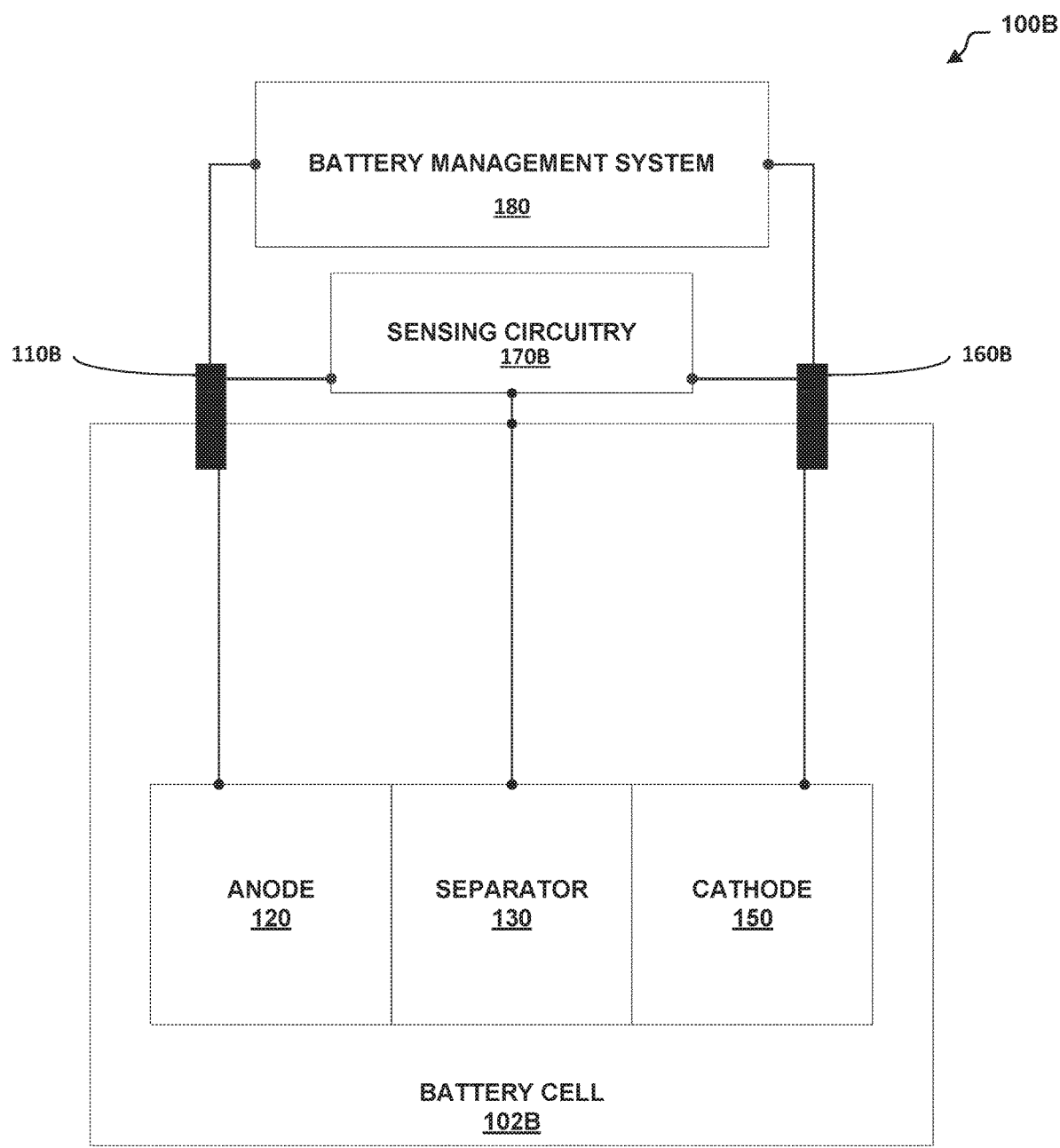
FIG. 2 is a schematic diagram illustrating another battery system including a battery cell, a battery management sys

Another embodiment of a battery system 100B is shown in FIG. 2. FIG. 2 is identical to the FIG. 1, except, as illustrated in FIG. 2, the sensing circuitry 170B can be coupled externally to the battery cell 102B via the anode tab 110B and the cathode tab 160B.

In some embodiments the battery cell 102B is part of a closed system. In a closed system, after the battery cell 102B is produced, the casing that surrounds the battery cell 102B is sealed to prevent external elements, such as air and moisture, from entering the battery cell 102B and potentially causing degradation of the battery cell 102B resulting in reduced performance and shorter life of the battery cell 102B.

However, a closed battery cell 102B presents various challenges to the battery management system 180. The closed system does not allow the direct observation of the condition of the components of the battery cell 102B. Instead, the sensing circuitry 170B monitors and/or measures characteristics (e.g. voltage, current, resistance, power, temperature and/or combinations thereof) of the battery cell 102B while the battery cell 102B is operating or at rest. The sensing circuitry 170B can transmit the one or more measured characteristics to the battery management system 180, and the battery management system 180 can receive the one or more measured characteristics and determine the condition of the battery cell 102B based at least in part on the one or more measured characteristics.

Various models have been developed to model the electrochemical reactions occurring within the battery cell 102B. One example, was developed by Fuller, Doyle, and Newman, the (Newman Model), (*J. Electrochem. Soc.*, Vol. 141, No. 1, January 1994, pp. 1-10), the contents of which are hereby incorporated by reference in their entirety. The Newman Model provides a mathematical model which can be used to estimate the electrochemical processes occurring within the battery cell 102B based on the measured characteristics.

The charge transfer reactions at the anode 120, and cathode 150, may be modelled by an electrochemical model, such as the Newman Model, providing the basis to describe various battery cell 102B parameters during both the charging and discharging of the battery cell 102B. For example, the Newman Model may allow the estimation of various parameters including cathode particle radius, which can vary due to the degree of lithiation of the cathode 150, which also may be called the state-of-charge of the battery cell 102B, anode particle radius, ion diffusion rates in the anode 120, cathode 150, and electrolyte, intercalation current and transference number, solution conductivity in the anode 120, cathode 150, and electrolyte, cell porosity of the anode 120 and cathode 150, and equilibrium potential of the anode 120 and cathode 150.

Physics based electrochemical models, such as the Newman Model, may include ordinary and partial differential equations (PDEs) to describe the behavior of the various parameters within the battery cell 102B. The Newman Model is an electrochemical-based model of the actual chemical and electrical processes occurring in the Li-ion batteries. However, the full Newman Model is extremely complex and requires a large number of immeasurable physical parameters to be identified. Identification of such large set of parameters involved in the nonlinear PDE and differential algebraic equations (DAEs) with current computational capacity is impractical. This gives rise to various electrochemical models that approximate the dynamics of the Newman Model.

For example, the Reduced-Order-Model (ROM), Mayhew, C.; Wei He; Kroener, C.; Klein, R.; Chaturvedi, N.; Kojic, A., "Investigation of projection-based model-reduction techniques for solid-phase diffusion in Li-ion batteries," American Control Conference (ACC), 2014, pp. 123-128, 4-6 Jun. 2014, the contents of which are hereby incorporated by reference in their entirety, allows the model order reduction of the Newman Model of Li-ion cells while retaining the complete model structure of the of the baseline cell. The ROM of the Newman Model is able to accurately predict behavior of a truth model, compared to less realistic approximate models such as Single Particle Model, while reducing computation time and memory requirements. The Newman Model reduction by ROM, introduces a large number of states and parameters involved in highly nonlinear partial differential equations and differential algebraic equations of the ROM dynamical system. This contributes to the complexity of the parameter and state identification process. Herein we describe methods of parameter and state estimation for the highly nonlinear and complex ROM. These methods are based on online reception of measurement data and achieve a high speed of estimation.

Figure 3:
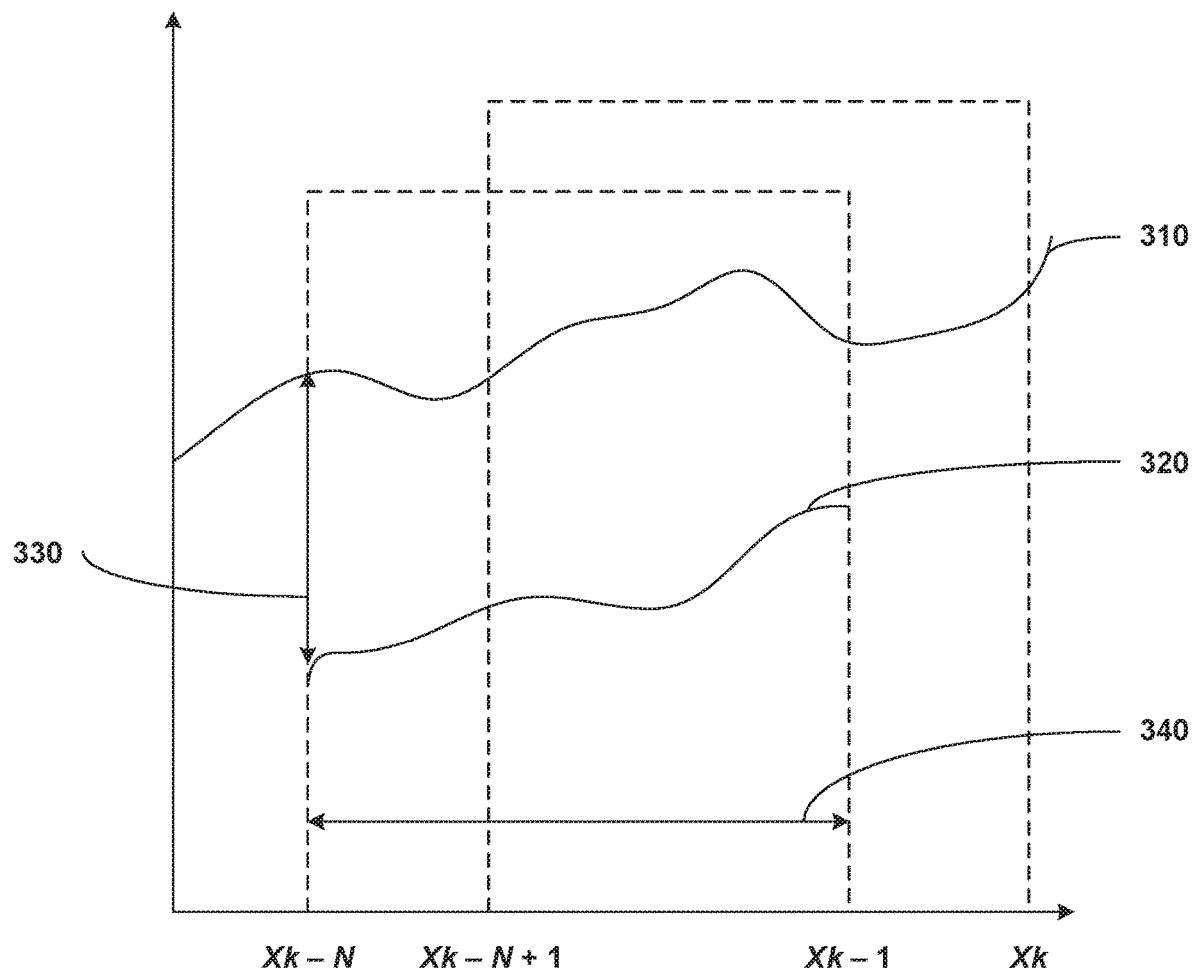
- FIG. 3 is a schematic diagram illustrating a Moving Horizon Estimation Filter, in accordance with some embodiments.

FIG. 3 illustrates an embodiment of the basic functioning of a Moving Horizon Estimation method (MHE). Moving Horizon Estimation (MHE) method is a model predictive estimator which can be used by a controller (e.g., a controller that operates as a battery management system) to solve an open-loop control problem by using the current states and parameters of the modeled system as the initial states of the modeled system at the next discrete time interval. Predictive estimators, such as the Moving Horizon Estimation (MHE) method, use a moving window of the most recent information and carry over the last estimate to the next time instant. MHE uses a series of continuously sampled measurements over time to estimate the states and parameters of the system. The measurements may contain noise in addition to the measurement. The states, parameters, and noise may be estimated by solving the mathematical model within a set of constraints.

As illustrated in FIG. 3, an actual measured characteristic of the battery cell 102B is represented as 310. An estimate of the characteristic of the battery cell 102B is represented as 320. The MHE method seeks to minimize the difference (error) 330 between the estimated value of the characteristic and the actual measured value of the characteristic over a series of discrete time measurements 340 collected over a predetermined time horizon. That is, a cost function of the MHE method is composed of the deviation of the estimated output (e.g., an error between the measured characteristic and the estimated characteristic) from the measured output and an arrival cost that assumes a weight on the previously estimated states and parameters.

The arrival cost summarizes the effect of the previously measured and estimated data on the current estimation. For a linear unconstrained system or systems, a Kalman Filter covariance update formula can compute the arrival cost explicitly. However, a non-linear unconstrained system can be linearized at the currently estimated point and removing the constraints, and then the Kalman Filter can be employed to the approximated system. This application of the Kalman Filter to the approximated system is defined as an Extended Kalman Filter (EKF).

To apply the MHE method to the ROM dynamical system, a battery management system (e.g., the battery management system 180 as described above) can determine a time varying arrival cost gain for each parameter based on its estimation robustness. Additionally, the battery management system can characterize the effect of parameters identifiability in the estimation process and suspension of estimation under low excitation.

To determine a time varying arrival cost gain for each parameter, the battery management system can use a modified Extended Kalman Filter (EKF) method. In the implementation of EKF in an arrival cost of the MHE method, the battery management system may assume that the probability density functions of the noises in states, parameters and output are shape invariant Gaussian distributions, that is, Gaussian distributions with time-invariant covariance matrices. However, battery cells undergo varying discharge, charge, and idle operations during relatively short time periods as the vehicle accelerates, decelerates, and stops during operation. From simulation and empirical data, different parameters and states of the Reduced Order Model (ROM) of Li-ion battery have different noise levels and different influence on the output and their noise and influence levels depend on the battery's state of operation. Accordingly, the battery management system may assume that the noise covariance matrix in estimation of states and parameters is a time-varying matrix that depends on the sensitivity of output on states and parameters at each horizon. Thus, the battery management system may employ different notions of states and parameters' sensitivity such as partial derivatives of output versus states and parameters and variations in the output over one drive cycle due to perturbation in states and parameters.

Additionally, the battery management system may also define a direct relation between noise covariance matrix and the sensitivity of output on parameters and states. The noise covariance matrix has an inverse relation with the arrival cost gains. For example, if the sensitivity of a parameter or state is gradually decreasing over a drive cycle, then the entries in the noise covariance matrix associated with that parameter or state will also decrease which results in an increase in the associated arrival cost gain. If the arrival cost gain increases then the rate of change in that parameter or state during the prediction phase decreases and hence the parameter or state will have a higher tendency to retain its current value. The battery management system may use this inverse relationship to create an automatic estimation suspension mechanism which smoothly takes the focus away from the estimation of one or more parameters and/or states.

To identify states and parameters, the battery management system may employ various methods. For example, the battery management system suspends the estimation process, that is, the battery management system sets the parameters equal to the last identified values and predicted the states according to the system dynamics under a low input persistency of excitation. In this example, the battery management system may define an input persistency of excitation to be an integration of a power gain of a current over the estimation time horizon. In another example, the battery management system may suspend the estimation of one or more parameters under low gradient of output or states function versus those parameters.

Figure 4:
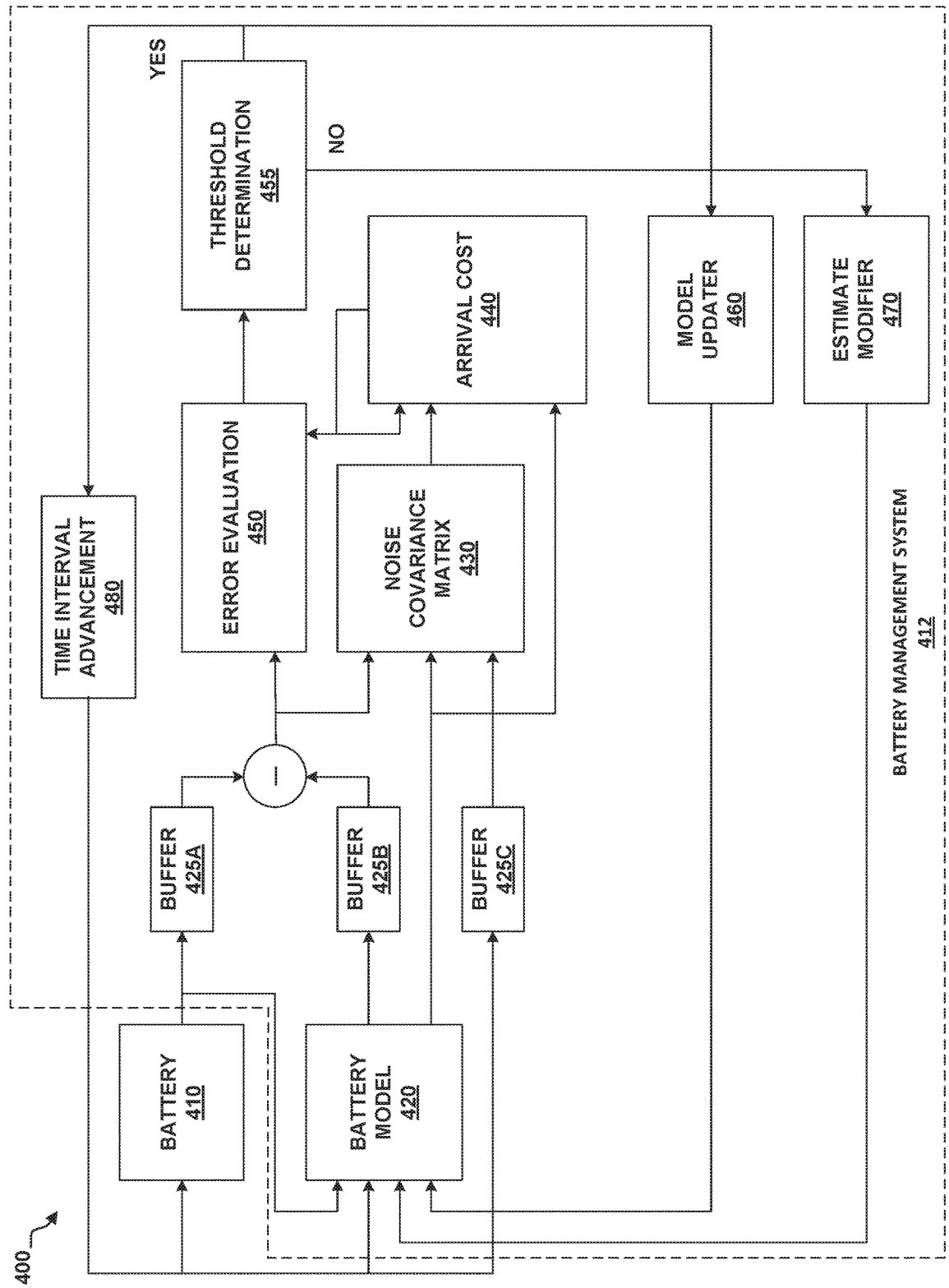
FIG. 4 is a block diagram illustrating the operation of a battery management system, in accordance with some embodiments.

An example of an MHE is illustrated in FIG. 4. FIG. 4 is a block diagram illustrating the management of a battery system 400, in accordance with some embodiments. In the example of FIG. 4, the battery system 400 includes a battery 410 and a battery management system 412. The battery management system 412 includes a battery estimator 420, buffers 425A, 425B, 425C, noise covariance matrix 430, arrival cost 440, error evaluation 450, threshold determination 455, a model updater 460, estimate modifier 470, and time interval advancement 480.

A MHE method can be applied to various physical, mathematical, and electrochemical models of a battery 410. At the first time step, the battery management system 412 receives at least one measured characteristic (e.g., voltage and/or current) of the battery 410 over a pre-defined time horizon from at least one sensor (i.e., the characteristics of the battery 410 are sampled) at buffer 425A and 425C. At the first time step, the battery management system 412 also receives at least one estimated characteristic (e.g., an initial estimate of the states and parameters of the battery model 420) based on the previous time interval from battery model 420. The previous time interval is defined as part of the time interval advancement 480. The at least one estimated characteristic is provided to buffer 425B. An initial estimate of the noise covariance matrix 430 is generated for these states and parameters. For the first time step there is no data from the previous time step of the series to act as initial conditions. An initial estimate of the states and parameters is generated from the battery model 420 based on values not of this time series (e.g., historical operation or manufacturers specifications).

A representation of the states and parameters of the battery 410 and the corresponding states and parameters from the battery model 420 is provided in Equations 1 and 2 respectively.

$$\dot{x}(t)=f(x(t),\theta,I(t))$$
$$0=g(x(t),\theta,I(t))$$
$$V(t)=h(x(t),\theta,I(t)) \quad (1)$$
$$\dot{\hat{x}}(t)=f(\hat{x}(t),\hat{\theta},I(t))$$
$$0=g(\hat{x}(t),\hat{\theta},I(t))$$
$$\hat{V}(t)=h(\hat{x}(t),\hat{\theta},I(t)) \quad (2)$$

In Equations 1 and 2, x represents the states, θ represents the parameters, I represents the current inputs, and V represents the outputs. The Jacobian of the system with respect to the states and parameters is derived based on the partial derivatives of Equation 2 as shown in Equation 3 and the noise covariance matrix 430 is then updated for the current time step.

$$\frac{\partial f}{\partial \hat{x}}, \frac{\partial g}{\partial \hat{x}}, \frac{\partial h}{\partial \hat{x}}, \frac{\partial f}{\partial \hat{\theta}}, \frac{\partial g}{\partial \hat{\theta}}, \frac{\partial h}{\partial \hat{\theta}} \quad (3)$$

$$COV(t+1) = (J_f(t)COV(t)J_f(t)^T + Q(t) - \quad (4)$$
$$J_f(t)COV(t)J_h(t)^T(R(t)+J_h(t)COV(t)J_h(t)^T)J_h(t)COV(t)J_f(t)^T)$$

In Equation 4, COV(t+1) is the covariance at t+1, $J_f$ is the Jacobian of f, $J^T_f$ is the transpose of the Jacobian of f, $J_h$ is the Jacobian of h, $J^T_h$ is the transpose of the Jacobian of h, COV(t) is the covariance at t, Q(t) is a noise covariance matrix associated with the states and parameters, and R(t) is a noise covariance matrix associated with the outputs.

The noise covariance matrix 430 of the estimation of states and parameters is calculated from the battery model 420 with the noise contributions assumed to be time invariant over the measurement horizon. The noise covariance matrix 430 may additionally depend on the sensitivity of the output on the states and the parameters at each horizon. In order to capture the contribution of data as the time horizon is advanced an arrival cost 440 is determined by the battery management system 412. In some embodiments, the arrival cost 440 may be determined by the battery management system 412 using an Extended Kalman Filter approach based on the at least one measured characteristic and the at least one estimated characteristic of the battery 410. In some embodiments, the Kalman Filter gain is inversely related to the arrival cost.

To implement the Extended Kalman Filter approach, the battery management system 412 determines a cost function of the Moving Horizon Estimation method based on the at least one measured characteristic and the at least one estimated characteristic. For example, the battery management system 412 uses the error evaluation module 450 to generate an amount of error present for each element of the data set by comparing the measured characteristics of the battery 410 with the estimated characteristics (e.g., the states) of the battery model 420. Further, the battery management system 412 uses the threshold determination 455 to compare the error between each measured and estimated parameter or state to a predetermined threshold.

If the battery management system 412 determines that the amount of error is less than a predetermined threshold, then the accuracy of the battery model 420 is verified, and the battery management system 412 updates the states and parameters of the battery model 420 using the model updater 460. The updated states and parameters of the battery model 420 act as the initial states for the next iteration and the time step is advanced (e.g., t=t+1) with time interval advancement 480.

If the battery management system 412 determines that the amount of error is greater than a predetermined threshold, the accuracy of the battery model 420 is not verified, and the battery management system 412 modifies the states and parameters of the battery model 420 using the estimate modifier 470. The estimation process of the battery management system 412 is reevaluated until the battery model 420 is verified as accurate and updated by the battery management system 412.

After updating the battery model 420, the battery management system 412 estimates at least one state of the battery 410 by applying the electrochemical-based model of the battery model 420. In the example of FIG. 4, the estimation of the at least one state may include estimation of the state-of-charge (SOH) and/or the state-of-health (SOH) of the battery 410 synchronously. While the estimation of SOC and SOH is performed synchronously the gains associated with the noise covariance matrices of the states and parameters may be developed together or separately. Further, after estimating the at least one state, the battery management system 412 regulates at least one of charging or discharging of the battery 410 based on the estimation of the at least one state of the battery 410.

Figure 5:
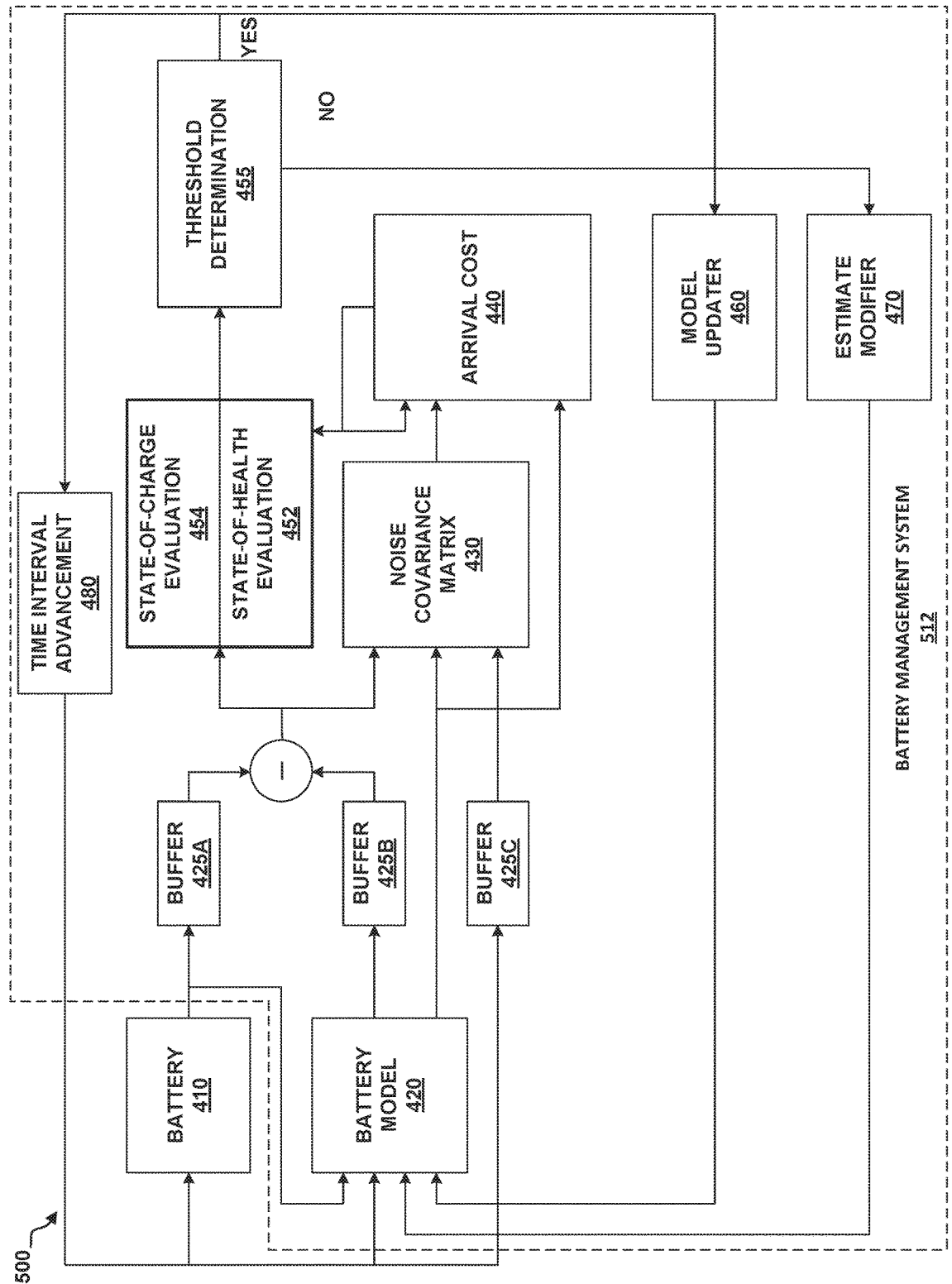
FIG. 5 is a block diagram illustrating the operation of another battery management system, in accordance with some embodiments.

FIG. 5 is a block diagram illustrating the operation of another battery management system 512, in accordance with some embodiments. The system 500 of FIG. 5 is identical to the system 400 of FIG. 4 except the battery management system 512 evaluates states separately. For example, the battery management system 512 determines a cost function associated with the state-of-health at the state-of-health evaluation 452. Similarly, the battery management system 512 determines a cost function associated with the state-of-charge at the state-of-charge evaluation 454. In the example of FIG. 5, the battery management system 512 evaluates the states and parameters asynchronously according to the difference in the time scale associated with the states and parameters. For slowly varying parameters (e.g., state-of-health), the battery management system 512 evaluates the parameters at a pre-defined time. For example, the pre-defined time is once every 10, 25, 50, 100, 150, 200, or more than 200 cycles (e.g., drive cycles of a vehicle) compared to a state (e.g., state-of-charge) that may be evaluated every second, each cycle, or other suitable time period. For rapidly varying parameters (e.g., state-of-charge), the battery management system 512 evaluates the parameters continuously.

The set of outputs from the electrochemical model via the MHE include evaluations of both rapidly varying states of the battery cell 102B and evaluations of slowly varying parameters of the battery cell 102B. In some embodiments the state of the battery cell 102B in combination with the present input to the mathematical model allows the model to predict the present output of the battery cell 102B. States of a battery cell may for example include the state-of charge, for a lithium battery the degree of lithiation, or the hysteresis levels of the battery. Parameters of the battery cell 102B are typically more slowly varying over time than the states of the battery cell 102B. Additionally, a parameter may not be required for the model to predict the present output of the battery cell 102B. Instead knowledge of the parameters of battery cell 102B, which may be called the state-of-health of the battery, relate to the long term functioning of the battery cell 102B. For example, the functioning of the battery cell 102B over one or more charge/discharge cycles. Additionally, some embodiments comprise parameters which are not directly determinable from the measurement of the current battery cell 102B characteristics. Examples of battery cell 102B parameters include the maximum power capacity, maximum power output, and internal resistance.

The embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling with the spirit and scope of this disclosure.

It is believed that embodiments described herein and many of their attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

While the invention has been described with reference to various embodiments, it will be understood that these embodiments are illustrative and that the scope of the disclosure is not limited to them. Many variations, modifications, additions, and improvements are possible. More generally, embodiments in accordance with the invention have been described in the context or particular embodiments. Functionality may be separated or combined in blocks differently in various embodiments of the disclosure or described with different terminology. These and other variations, modifications, additions, and improvements may fall within the scope of the disclosure as defined in the claims that follow.

What is claimed is:

1. A method of managing a battery system, the battery system including at least one battery cell, at least one sensor coupled to the at least one battery cell and configured to measure at least one characteristic of the at least one battery cell, and a battery management system coupled to the at least one sensor and including a microprocessor and a memory, the method comprising:
   receiving, by the battery management system, at least one measured characteristic of the at least one battery cell over a pre-defined time horizon from the at least one sensor;
   receiving, by the battery management system, at least one estimated characteristic of the at least one battery cell from an electrochemical-based battery model based on differential algebraic equations, the electrochemical-based battery model applying the differential algebraic equations to account for electrochemical processes and a physical chemical composition of the at least one battery cell;
   determining, by the battery management system, a cost function of a Moving Horizon Estimation method based on the at least one measured characteristic and the at least one estimated characteristic;
   updating, by the battery management system, the electrochemical-based battery model based on the cost function of the Moving Horizon Estimation;
   estimating, by the battery management system, at least one state of the at least one battery cell by applying the electrochemical-based battery model; and
   regulating, by the battery management system, at least one of charging or discharging of the at least one battery cell based on the estimation of the at least one state of the at least one battery cell.

2. The method of claim 1, wherein determining the cost function of the Moving Horizon Estimation method includes
   determining an error between the at least one measured characteristic and the at least one estimated characteristic; and
   determining an arrival cost that has a weight based on previously estimated states and parameters.

3. The method of claim 2, wherein determining the arrival cost includes determining the arrival cost using a Kalman Filter when the battery system is a linear unconstrained system.

4. The method of claim 2, wherein determining the arrival cost includes
   linearizing the battery system when the battery system is a non-linear constrained system; and
   determining a time varying arrival cost gain for each parameter based on a estimation robustness of each parameter using a modified extended Kalman Filter.

5. The method of claim 1, wherein the at least one state of the at least one battery cell includes at least one of a state-of-charge or a state-of-health of the at least one battery cell.

6. The method of claim 5, wherein estimating the at least one state of the at least one battery cell by applying the electrochemical-based battery model includes synchronously estimating the state-of-charge and the state-of-health of the at least one battery cell.

7. The method of claim 5, wherein estimating the at least one state of the at least one battery cell by applying the electrochemical-based battery model includes separately estimating the state-of-charge and the state-of-health of the at least one battery cell, wherein the state-of-charge of the at least one battery cell is estimated continuously, and wherein the state-of-health of the at least one battery cell is estimated at a pre-defined time.

8. The method of claim 7, wherein the pre-defined time is one hundred drive cycles.

9. The method of claim 1, further comprising suspending the estimation of the at least one state of the at least one battery cell under a low input persistency of excitation or under a low gradient of output.

10. The method of claim 1, wherein the electrochemical-based battery model is a Reduced-Order-Model of a Newman model.

11. A battery management system comprising a processor and a memory storing instructions that, when executed by the processor, cause the battery management system to:
   receive at least one measured characteristic of at least one battery cell over a pre-defined time horizon from at least one sensor, wherein the at least one battery cell and the at least one sensor are part of a battery system;

receive at least one estimated characteristic of the at least one battery cell from an electrochemical-based battery model based on differential algebraic equations, the electrochemical-based battery model applying the differential algebraic equations to account for electrochemical processes and a physical chemical composition of the at least one battery cell;

determine a cost function of a Moving Horizon Estimation based on the at least one measured characteristic and the at least one estimated characteristic;

update the electrochemical-based battery model based on the cost function of the Moving Horizon Estimation;

estimate at least one state of the at least one battery cell by applying the electrochemical-based battery model; and regulate at least one of charging or discharging of the at least one battery cell based on the estimation of the at least one state of the at least one battery cell.

12. The battery management system of claim 11, wherein determine the cost function of the Moving Horizon Estimation includes instructions that, when executed by the processor, cause the battery management system to determine an error between the at least one measured characteristic and the at least one estimated characteristic; and determine an arrival cost that has a weight based on previously estimated states and parameters.

13. The battery management system of claim 12, wherein determine the arrival cost includes instructions that, when executed by the processor, cause the battery management system to determine the arrival cost using a Kalman Filter when the battery system is a linear unconstrained system.

14. The battery management system of claim 12, wherein determine the arrival cost includes instructions that, when executed by the processor, cause the battery management system to linearize the battery system when the battery system is a non-linear constrained system; and determine a time varying arrival cost gain for each parameter based on a estimation robustness of each parameter using a modified extended Kalman Filter.

15. The battery management system of claim 11, wherein the at least one state of the at least one battery cell includes at least one of a state-of-charge or a state-of-health of the at least one battery cell.

16. The battery management system of claim 15, wherein estimate the at least one state of the at least one battery cell by applying the electrochemical-based battery model includes instructions that, when executed by the processor, cause the battery management system to synchronously estimate the state-of-charge and the state-of-health of the at least one battery cell.

17. The battery management system of claim 15, wherein estimate the at least one state of the at least one battery cell by applying the electrochemical-based battery model includes instructions that, when executed by the processor, cause the battery management system to separately estimate the state-of-charge and the state-of-health of the at least one battery cell, wherein the state-of-charge of the at least one battery cell is estimated continuously, and wherein the state-of-health of the at least one battery cell is estimated at a pre-defined time.

18. The battery management system of claim 17, wherein the pre-defined time is one hundred drive cycles of a vehicle.

19. The battery management system of claim 11, further comprising instructions that, when executed by the processor, cause the battery management system to suspend the estimation of the at least one state of the at least one battery cell under a low input persistency of excitation or under a low gradient of output.

20. The battery management system of claim 11, wherein the electrochemical-based battery model is a Reduced-Order-Model of a Newman model.

* * * * *